(12) United States Patent
Varshavsky

(10) Patent No.: US 6,198,336 B1
(45) Date of Patent: Mar. 6, 2001

(54) THRESHOLD ELEMENT

(75) Inventor: Victor I. Varshavsky, Aizu-Wakamatsu (JP)

(73) Assignee: Monolith, Company, Ltd. (JP)

( * ) Notice: Subject to any disclaimer, the term of this patent is extended or adjusted under 35 U.S.C. 154(b) by 0 days.

(21) Appl. No.: 09/370,460

(22) Filed: Aug. 9, 1999

(51) Int. Cl.[7] .................................................. H03K 17/687
(52) U.S. Cl. .............................. 327/427; 327/426; 326/36
(58) Field of Search .................................... 327/436, 437; 326/35, 36

(56) References Cited

U.S. PATENT DOCUMENTS 3,715,603 * 2/1973 Lerch ...................................... 326/36
4,896,059 * 1/1990 Goodwin-Johansson .............. 326/36

* cited by examiner

Primary Examiner—Terry D. Cunningham
Assistant Examiner—Quan Tra
(74) Attorney, Agent, or Firm—Morrison & Foerster, LLP

(57) ABSTRACT

A threshold element enabling a logical operation with fewer transistors and easy design and setting of an element weight and a threshold value is provided. In a threshold element of the present invention, MIS (Metal Insulator Semiconductor) transistors each passing a drain current upon excitation corresponding to weight $\omega i$ of input Xi obtained from a logical expression $Y=\text{Sign}(\Sigma\omega i X i-1)$ derived from $Y=F(Xi)$ thereof are connected in parallel. A terminal for transmitting an input signal Xi corresponding to each of the transistors is connected to the gate electrode thereof. By this input signal, excitation of each of the transistors is controlled. An output voltage based on a sum of the drain currents from the transistors is compared with a threshold value by a comparing inverter, and a comparison result is output.

10 Claims, 4 Drawing Sheets

THRESHOLD ELEMENT

BACKGROUND OF THE INVENTION

1. Field of the Invention

The present invention relates to a threshold element used in a logical operation circuit. More specifically, the present invention relates to a threshold element using a MIS (metal insulator semiconductor) transistor.

2. Description of the Related Art

As conventional threshold elements, threshold elements based on output-wired CMOS (complementary metal-oxide semiconductor) inverters have been known. FIG. 8 shows a configuration of a conventional threshold element using an output-wired CMOS inverter. In this element, each of inputs $X_1, X_2, \ldots X_n$ has a corresponding inverter 1, 2, ... n. Outputs from these inverters are all wired together, creating an output voltage Vout. The output voltage Vout is input to a comparing inverter 10. A threshold value of the comparing inverter (judging inverter) 10 is set appropriately so that a majority result can be converted into binary data properly. In this threshold element, the output voltage Vout reflecting a sum of the outputs from the inverters 1 through n corresponding to the inputs $X_1$ through $X_n$ is compared with a threshold value by the comparing inverter. If the output voltage Vout is larger than the threshold value, "1" is output as a final result y. Otherwise, "0" is output. The threshold element can be used for various kinds of logical operations, by applying an appropriate weight to each of the inputs $X_1$ through $X_n$ and setting a suitable threshold value to the comparing inverter 10.

In the above-described conventional technique, at least 2 transistors are required for each input, which leads to a problem that a large area on a substrate is occupied by the threshold circuit. Furthermore, weighting each inverter for each input as well as designing and setting the proper threshold value for the judging inverter are complicated.

An object of the present invention is therefore to provide a threshold element enabling a logical operation with fewer transistors, easy element weighting, and easy design and setting of the threshold value.

SUMMARY OF THE INVENTION

In order to achieve the above object, a threshold element of the present invention comprises MIS (Metal Insulator Semiconductor) transistors connected in parallel each passing a drain current in accordance with ωi obtained by an expression Y=Sign (ΣωiXi−1) transformed from a logical expression Y=F(Xi) upon excitation thereof and each having a terminal connected to a gate electrode thereof for transmitting a corresponding input signal Xi controlling the excitation thereof, and a comparing inverter for comparing an output voltage in accordance with a sum of the drain current from each of the transistors with a threshold value and for outputting a comparison result.

In the threshold element of the present invention, the MIS transistors may determine their β values by the width and length of their gate electrodes. It is more preferable for the threshold element that each unit of the MIS transistor further comprises a second MIS transistor as means for transmitting the input signal Xi so that the transistor unit can be switched on and off by the input signal applied to a gate electrode of the second transistor, while an effective β value of the transistor unit can be adjusted by a voltage applied to a gate electrode of the first transistor.

According to the threshold element of the present invention, by setting each of the transistors connected in parallel in a state such that the drain current corresponding to ωi flows therethrough upon excitation thereof, the threshold value of the comparing inverter can always be set to a predetermined value, and design and setting of the threshold element becomes far easier than those of a conventional threshold element. Furthermore, according to the threshold element of the present invention, only one transistor is necessary in principle for each input. Therefore, the threshold element can be formed with fewer transistors. Moreover, if the β value for passing the drain current corresponding to ωi can be changed by the voltage applied to the gate electrode of each of the transistors, the ωi values can be changed upon necessity after designing and forming the threshold element, by changing the voltage applied to the gate electrode of each of the transistors. Therefore, a logical operation circuit with fewer threshold circuits can be formed.

For example, if a logical expression Y is a logical sum or logical product of n inputs Xi, a conventional threshold element needs 2n transistors except for a comparing inverter, whereas the present invention needs (n+1) transistors which are approximately half of the transistors for the conventional element. Furthermore, in the case where the threshold element is incorporated into an integrated circuit, all inputs are applied to the transistors of the same channel type connected in parallel. Therefore, extremely easy design and layout can be realized. More specifically, for example, if the logical expression Y is a 3-input logical expression such as $X_1$ $(X_2+X_3)$, $X_1X_2+X_2X_3+X_3X_1$, and $X_1X_2X_3$, the conventional threshold element needs 6 transistors in addition to a comparing inverter, while the threshold element of the present invention needs only 4 transistors. Furthermore, NOT logic can be dealt with by inserting an inverter.

DESCRIPTION OF THE PREFERRED EMBODIMENT

A logical expression Y is expressed as follows:

$$Y = \text{Sign}(\Sigma W_i X_i - T) \tag{1}$$

Assume Sign(A)=1 if A≧1 and Sign(A)=0 if A<0. In the above-described expression, Σ means a total sum for i=1, 2, . . . n. Wi is a weight for an i-th input, and T is a threshold value. By transforming the expression, $$Y = \text{Sign}(\Sigma \omega i X i - 1) \quad (2)$$

where $\omega i = W i / T$ is obtained. According to this expression, the threshold value can be set constant.

Figure 1:
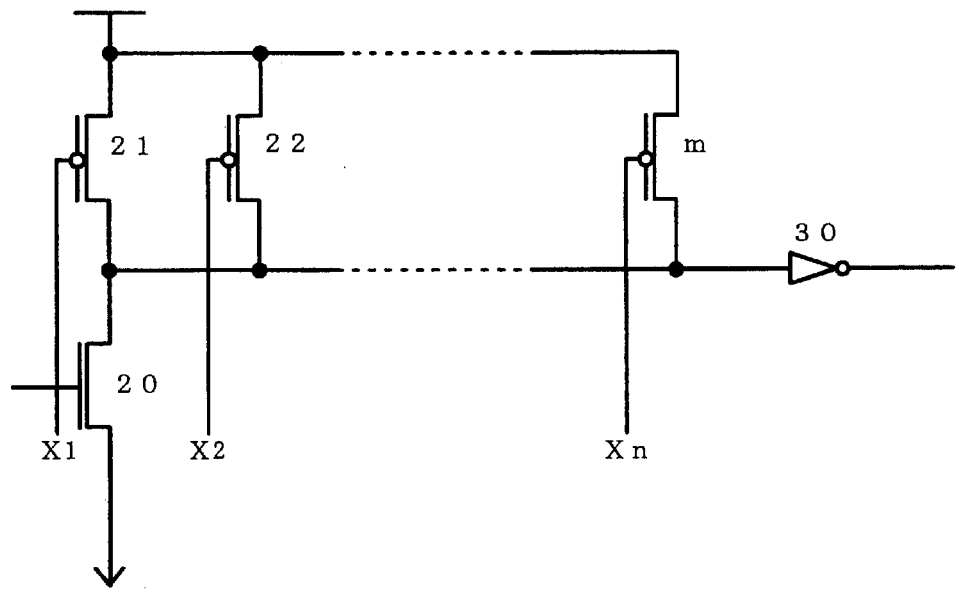
FIG. 1 is a circuit diagram showing an embodiment of a threshold element of the present invention.

FIG. 1 is a circuit diagram showing a threshold element representing the logical expression (2).

Each of MIS transistors 21, 22, . . . m has a β value (which will be described later) corresponding to $\omega i$. A threshold value of a comparing inverter 30 is set to a value corresponding to the term "1" of $\text{Sign}(\Sigma \omega i X i - 1)$ in the logical expression. One of terminals other than a gate electrode of each of the MIS transistors 21 through m is pulled up by a power supply and the other is grounded via a transistor 20 which stays ON constantly. Alternatively, the transistor 20 may be pulled up by the power supply whereas the MIS transistors may be grounded. A drain current from each of the transistors 21 through m is added up and a voltage Vout determined by a relationship between the total drain current and an output from the transistor 20 is input to the comparing inverter 30 which compares the voltage Vout with a predetermined threshold value. An input signal is connected to the gate electrode of each of the transistors 21 through m, and controls the excitation of each of the transistors in response to an input Xi.

A current amplification factor βj for a j-th MIS transistor can be expressed by the following well-known expression:

$$\beta j = \mu \epsilon / tox \cdot (Wj/Lj) = \mu \epsilon / tox \cdot (W0/L0) \omega j \quad (3)$$

where $\mu$ is electron mobility in a channel region, $\epsilon$ is a dielectric constant of an insulator, tox is the thickness of the insulator, and Wj and Lj are the width and the length of a gate electrode of the j-th transistor, respectively. Therefore, when a desired weight $\omega j$ is given, a necessary β value, βj, can be obtained by adjusting the width Wj and the length Lj of the gate electrode in a manner such that $(W0/L0)\omega j$, which is a product of a reference value W0/L0 and $\omega j$, is equal to $(Wj/Lj)$. In this manner, by determining the weight $\omega j$ corresponding to the input Xi to the transistor in accordance with the shape and size thereof, the transistor which can generate an output signal corresponding to $\omega j X j$ can be obtained.

If the threshold element is configured as has been described above, by integrating the transistors corresponding to an input function on one channel side and by placing the comparing inverter and the transistor of the other channel in a conventional layout, a substantially small threshold element carrying out an arbitrary logical operation can be formed in an integrated circuit.

Figure 2:
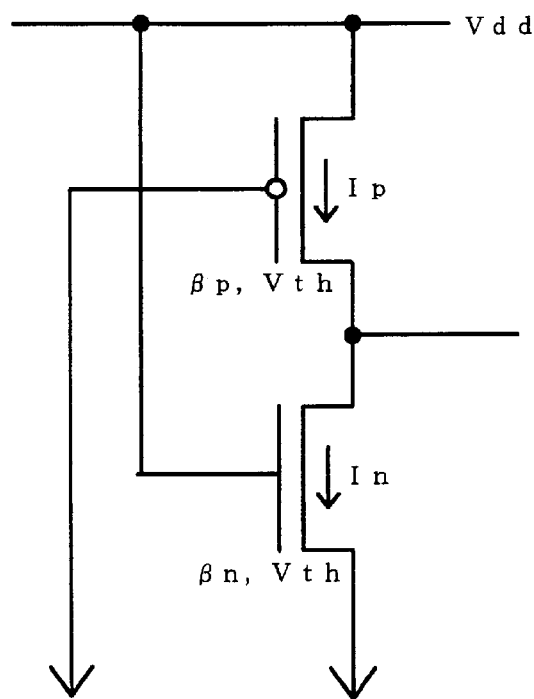
FIG. 2 is a circuit diagram of a CMOS inverter.

Furthermore, when a CMOS circuit is as shown in FIG. 2 wherein n-channel and p-channel MOS (Metal-Oxide Semiconductor) transistors in a fully conducting state are connected in series, if Vth<Vout<Vdd-Vth and both transistors are unsaturated, the following expressions are known to be satisfied:

$$In = \beta n((Vdd - Vth)Vout - Vout^2/2) \quad (4)$$

$$Ip = -\beta p((Vdd - Vth)(Vdd - Vout) - (Vdd - Vout)^2/2) \quad (5)$$

In and Ip are drain currents flowing through the n-channel and p-channel MOS transistors respectively, and βn and βp are current amplification factor of the transistors. Vdd is a power voltage applied to gates, and Vth is a threshold value of the transistors. For simplicity, the same threshold value is used for both transistors. Vout is an output voltage equivalent to a drain voltage.

Let In+Ip=0, Vdd=5V, Vth=0.8V, and $\alpha = \beta n / \beta p$. Addition of the terms in expressions (4) and (5) yields the following expression:

$$\alpha Vout(2(Vdd - Vth) - Vout) - (Vdd - Vout)(2(Vdd - Vth) - (Vdd - Vout)) = 0.$$

In other words, the following expression can be obtained:

$$\alpha Vout(8.4 - Vout) - (5 - Vout)(3.4 + Vout) = 0 \quad (6)$$

Finding a solution of $\alpha$ from this expression, $dVout/d\alpha$ is calculated as follows:

$$dVout/d\alpha = (8.4 - Vout)^2 Vout^2 / (142.8 - 6.8(5 - Vout)Vout) \quad (7)$$

Therefore, when $\alpha=1$, and Vout=2.5V, $dVout/d\alpha$ is approximately equal to 2.

In the circuit shown in FIG. 1, $\alpha = \Sigma_{j=1-m} \omega j x j$. Therefore, an output voltage change $\Delta$Vout while xj changes is approximately equal to $2\omega j$. When T=100, a minimum $\omega$ is 1/T, that is, the minimum $\omega$ takes 0.01 as its value. Therefore, a minimum output change is approximately 20 mV, for example. A difference of this method from the method using a threshold function based on the expression (4) is that the minimum output change $\Delta$Vout is determined only on the threshold value, not on $\Sigma_{j=1-m} \omega j$. The accuracy of a neuron using this threshold element and reproducibility of the threshold function are determined by the accuracy of the weight $\omega j$ obtained through learning. In other words, the above accuracy is dependent on the method of forming the weight of the input.

As is obvious from the expression (4), the drain current In flowing through the transistor and the current amplification factor βn of the transistor have a linear relationship. In addition, the drain current In has a monotone function relationship with the gate voltage. Therefore, by controlling the drain current by adjusting the gate voltage regardless of the shape of the gate electrode, the effective β value, βn, can be adjusted.

Figure 3:
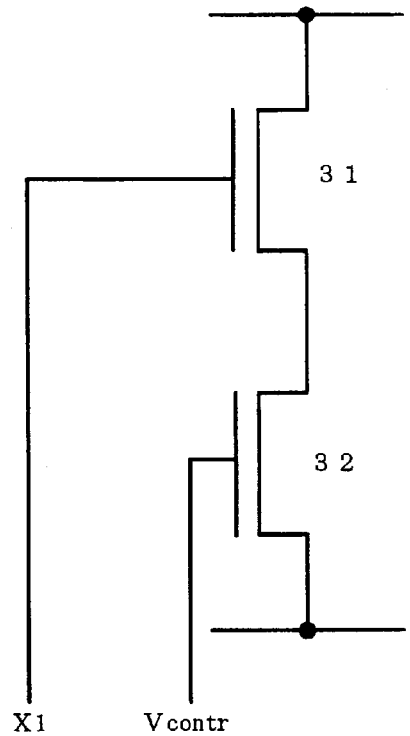
FIG. 3 is a circuit diagram of a transistor set used in a threshold element according to the embodiment of the present invention.

By using this fact, the threshold element allowing a change in the β value by changing the voltage applied to the gate electrode can be realized. FIG. 3 is a circuit diagram showing an input element of a threshold element enabling β value adjustment based on the voltage applied to the gate electrode thereof, instead of determining the β value by the shape of the electrode. The MIS transistor 21 in FIG. 1 is replaced with a transistor set comprising a first MIS transistor 31 and a second MIS transistor 32. The input Xi is applied to a gate electrode of the first MIS transistor 31, while an appropriate voltage Vcontr is applied to a gate electrode of the second MIS transistor 32. Since a current flowing through the transistor set while the transistor set fully conducts electric current can be adjusted by the voltage Vcontr, setting an effective β value of the transistor set corresponding to $\omega i$ becomes possible. One of the transistors in the transistor set is connected to a power supply, and the other is connected to a comparing inverter while being grounded via a transistor equivalent to the transistor 20 in FIG. 1.

Figure 4:
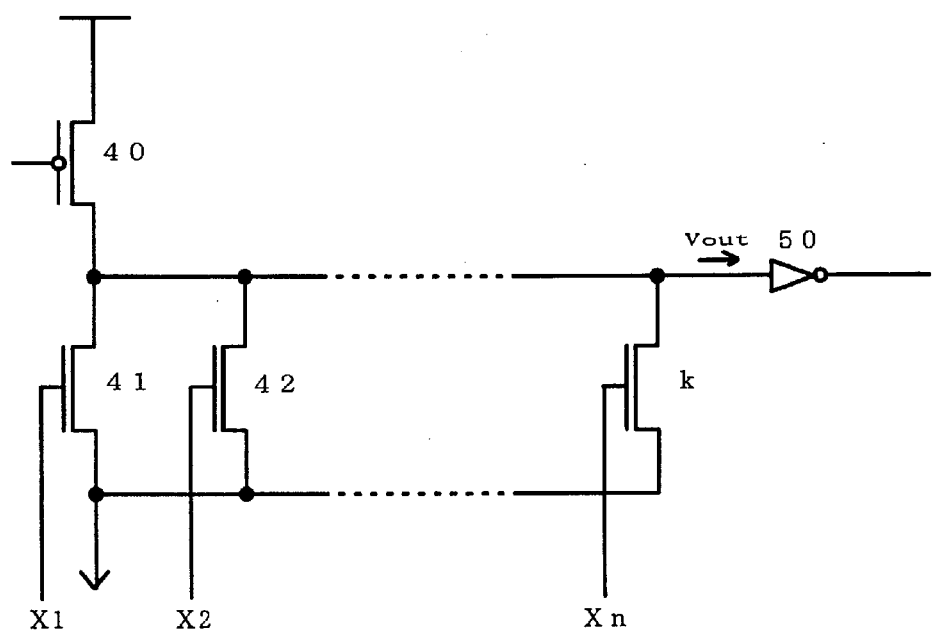
FIG. 4 is a circuit diagram showing another aspect of the threshold element according to the embodiment of the present invention.

The threshold element of the present invention enables to increase its switching-speed and reduce its power consumption, by using complementary-channel MIS transistors. FIG. 4 shows a circuit diagram of a threshold element of the present invention using MIS transistors having complementary channels, specifically using MOS transistors of n channel and p channel. One of terminals other than a gate electrode of each of n-channel MOS transistors 41, 42, . . . k connected in parallel is grounded. The other terminal is connected to a power supply via a p-channel MOS transistor 40 which is always ON, while being connected to an input terminal of a comparing inverter 50. The n-channel MOS transistors maybe exchanged for p-channel MOS transistors, while the p-channel transistor may be replaced with an n-channel transistor. In this case, the power supply and the ground are exchanged as well. In this example, an output voltage Vout is determined by a relationship between a current flowing through the p-channel MOS transistor 40 having an effective β value $β_p$, and a sum of currents flowing through any excited transistors out of n-channel MOS transistors 41 through k each having an effective β value $β_n$.

For easy design and setting, it is effective to set the following values as follows. The effective β value of p-channel MOS transistor 40 is set to a value approximately equal to 1 and having a deviation δ from 1 smaller than a value corresponding to the smallest ωi among ωi values. The effective β values of the n-channel MOS transistors 41 through k are all set to values relatively smaller than 1. A threshold value of the comparing inverter 50 is set to around the median value between the power voltage and the ground voltage. The deviation δ of the effective β value of the p-channel MOS transistor 40 is to absorb a variance depending on a product as well as a natural voltage fluctuation so that the comparing inverter 50 can judge properly at any time. The same effect can be obtained by allowing a value equivalent to the deviation δ to be included in the threshold value of the comparing inverter 50.

If the transistor set shown in FIG. 3 is used for the n-channel MOS transistors 41 through k, an operation of a different logical expression can be carried out by changing the effective β values of the n-channel MOS transistors. This is substantially convenient in terms of design and manufacturing. Hereinafter, some logical expressions according to this embodiment will be explained below.

If a logical expression Y is represented by Y=Σxi, or a logical sum of n Xi's, the value of the logical expression is 1 in the case where any one of the Xi's is 1. Therefore, the logical expression Y can be transformed into the following expression:

$$Y=\text{Sign}(\Sigma 1 \cdot Xi-1) \qquad (8)$$

In this case, all of the coefficients ωi's take 1. Therefore, if the effective β values for the n-channel MOS transistors 41 through k and the p-channel MOS transistor 40 shown in FIG. 4 are set to values corresponding to 1, and if the threshold value of the comparing inverter 50 is set to the median between the power voltage and the ground voltage, the threshold element for the above-mentioned logical expression Y can be obtained.

In other words, if all Xi's are 0, all the n-channel MOS transistors 41 though k become OFF, while the p-channel MOS transistor 40 is ON. Therefore, Vout takes a value closer to Vdd, and the output from the judging inverter 50 is 0. If any one of the inputs Xi's is 1, Vout is approximately equal to Vdd/2, and the output from the inverter 50 is 1. When a plurality of the inputs are 1, Vout takes a lower value than Vdd/2 and the output from the inverter 50 is 1.

In the case where the logical expression Y is a product of n Xi's, if and only if all of the Xi's are 1, the logical expression takes 1. Therefore, the logical expression Y can be transformed as follows:

$$Y=\text{Sign}(\Sigma(1/n)Xi-1) \qquad (9)$$

In this case, all the coefficients ωi are equal to 1/n. Therefore, if the effective β values of the n-channel MOS transistors 41 through k are changed to 1/n, a threshold element for the logical expression Y, which is a logical product of n Xi's, can be obtained without changing the threshold value of the inverter 50 and the β value of the p-channel MOS transistor 40 adopted in the case of the logical sum expression described above.

More specifically, basic 3-input logical expressions will be considered. First, take the case where the logical expression Y is $X_1(X_2+X_3)$. When $X_1$ is 1 and at least either $X_2$ or $X_3$ is 1, the logical expression takes 1. Therefore, the logical expression becomes as follows:

$$Y=\text{Sign}(2X_1+X_2+X_3-3)=\text{Sign}((2/3)X_1+(1/3)X_2+(1/3)X_3-1) \qquad (10)$$

Figure 5:
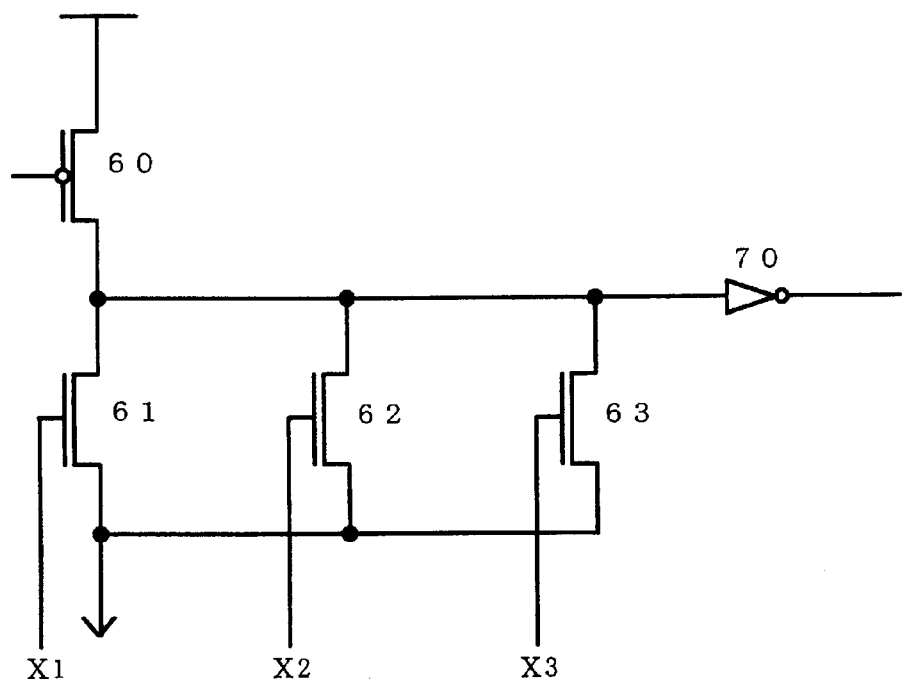
FIG. 5 is a circuit diagram for a logical operation carried out by a threshold element according to the embodiment of the present invention.

FIG. 5 is a circuit diagram showing a threshold element for this logical expression (10). Effective β values of a p-channel MOS transistor 60, an n-channel MOS transistor 61, and n-channel MOS transistors 62 and 63 are set to values corresponding to 1, ⅔, and ⅓, respectively. A threshold value of a comparing inverter 70 is set to a median between the power voltage and the ground voltage. Practically, it is preferable for the n-channel MOS transistors to be the transistor set shown in FIG. 2. In FIG. 5, means for changing the effective β value of the n-channel MOS transistors is not shown.

If the logical expression Y is $X_1X_2+X_2X_3+X_3X_1$, the expression takes 1 when at least any two of $X_1$ through $X_3$ are 1. Therefore, the logical expression Y can be transformed as follows:

$$Y=\text{Sign}((1/2)X_1+(1/2)X_2+(1/2)X_3-1) \qquad (11)$$

Figure 6:
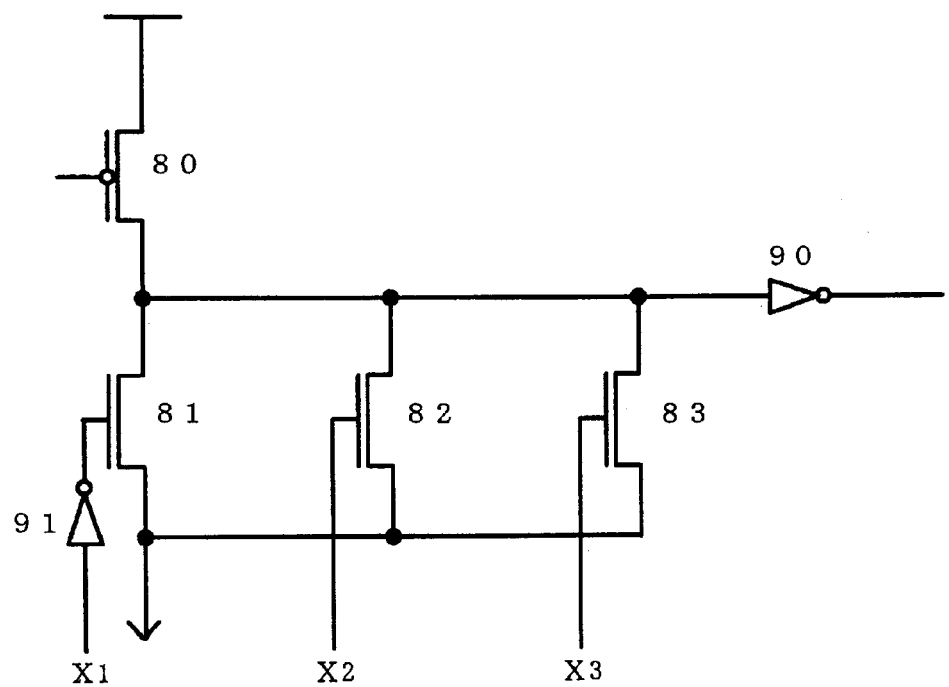
FIG. 6 is a circuit diagram for another logical operation carried out by a threshold element according to the embodiment of the present invention.

A threshold element for this expression Y is formed by merely setting the effective β values of the n-channel MOS transistors 61, 62 and 63 in FIG. 6 to ½. When the logical expression is $X_1X_2X_3$, the expression takes 1 when all Xi's are 1. Therefore, the logical expression can be expressed as follows:

$$Y=\text{Sign}((1/3)X_1+(1/3)X_2+(1/3)X_3-1) \qquad (12)$$

This expression can be dealt with by changing the β values of the n-channel MOS transistors 61, 62, and 63 to ⅓.

By using an inverter for NOT logic, a threshold element for a logical expression including NOT logic such as !$X_1X_2X_3$ (!$X_1$ represents negation of $X_1$, for example) can be formed. For example, if the logical expression Y is !$X_1X_2X_3$, the expression Y can be transformed as follows, by replacing $X_1$ in the expression (12) with !$X_1$:

$$Y=\text{Sign}((1/3)!X_1+(1/3)X_2+(1/3)X_3-1) \qquad (13)$$

FIG. 6 shows a circuit diagram of a threshold element for this logical expression Y. An effective β value of a p-channel MOS transistor 80 is set to 1, and those for n-channel MOS transistors 81, 82 and 83 are set to ⅓. A threshold value of a comparing inverter 90 is set to a median between the power voltage and the ground voltage. An inverter 91 is to invert an input Xi to a gate electrode of the n-channel MOS transistor 81. If the input $X_1$ is "1", the inverter 91 changes the input to "0". On the contrary, if the input $X_1$ is "0", the inverter 91 changes the input to "1". In this manner, the input Xi is changed to !Xi in order to correspond to NOT logic.

Likewise, in the case where the logical expression Y is !$(X_1+X_2+X_3)$, the logical expression takes 0 when $(X_1+X_2+X_3)$ takes 1. When $(X_1+X_2+X_3)$ is 0, then the logical expression Y takes 1. Therefore, the logical expression Y is transformed as follows:

$$Y=1-\text{Sign}((1/3)X_1+(1/3)X_2+(1/3)X_3-1) \qquad (14)$$

Figure 7:
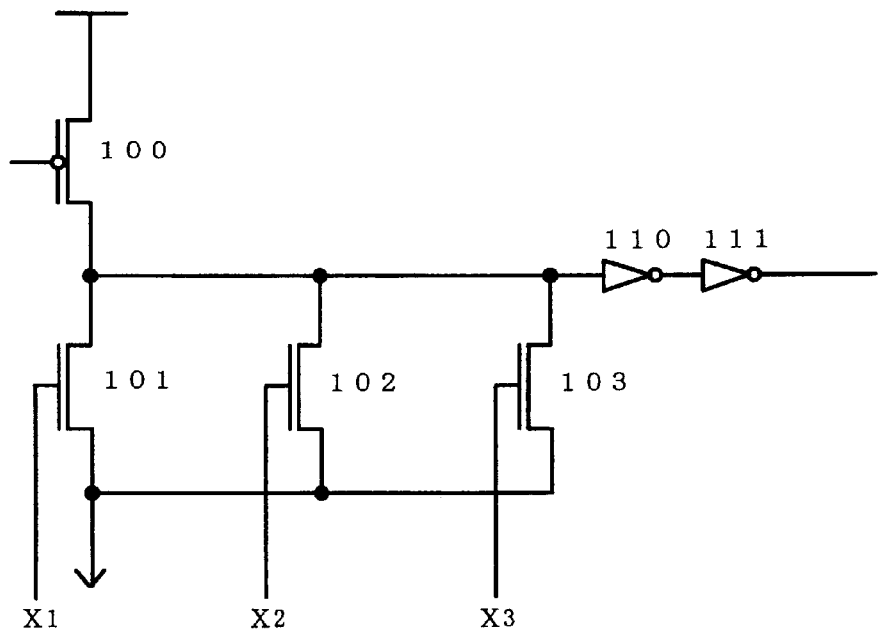
FIG. 7 is a circuit diagram for a still another logical operation carried out by a threshold element according to the embodiment of the present invention.
Figure 8:
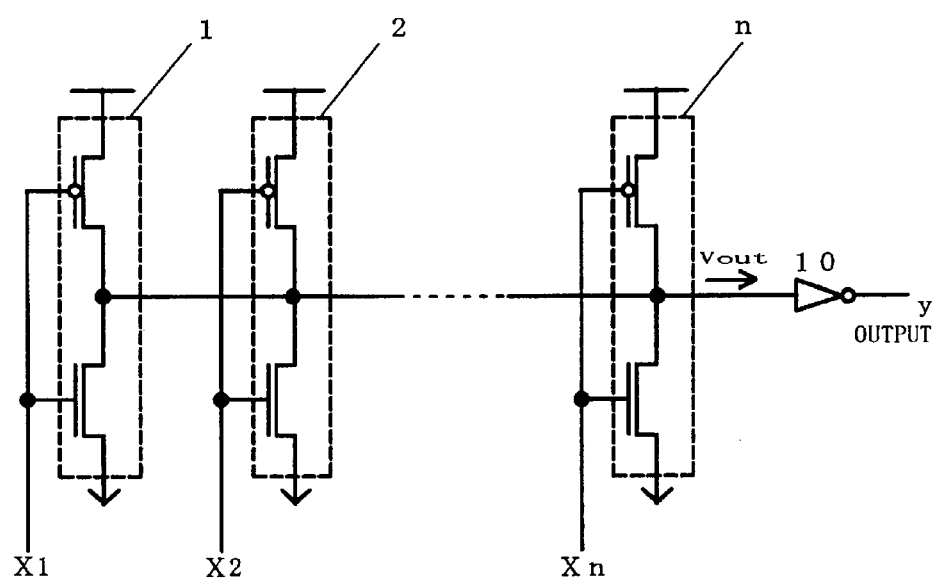
FIG. 8 is a circuit diagram of a threshold element according to a conventional technique.

A threshold element for this expression can be formed by inserting an inverter after a judging inverter of a threshold circuit for ($X_1+X_2+X_3$). FIG. 7 shows a circuit diagram of the threshold element for the expression (14). An effective β value of a p-channel MOS transistor 100 is set to 1, and those for n-channel MOS transistors 101, 102, and 103 are set to ⅓. A threshold value of a judging inverter 110 is set to a median between the power voltage and the ground voltage.

By inverting a judgment result from the judging inverter, that is, by inverting a result of ($X_1+X_2+X_3$) by using an inverter 111, an output from this threshold element shows a result of !(X1+X2+X3). In the embodiments shown in FIGS. 4 through 7, the cases where the input elements are configured by n-channel MOS transistors have been shown. However, it is needless to say that p-channel MOS transistors can be used instead of the n-channel MOS transistors. In this case, polarity of the inputs, outputs, the threshold values of the judging inverter, and the like are inverted.

More complex logical expressions can be transformed into the form of Sign($\Sigma \omega i X i - 1$). Hereinafter, an example of a general method of transforming the logical expression Y into Sign($\Sigma \omega i X i - 1$) will be explained.

First, the logical expression Y is transformed into Sign ($\Sigma W i X i - 1$). Wi's in this case can be determined in the order starting from the innermost parenthesis, based on the following rules. Xj means a j-th Xi when calculated from the innermost parenthesis.

1. If a term in a parenthesis shows a logical sum, a logical expression therefor is Sign($\Sigma X i - 1$), and if the term shows a logical product of n Xi's, a logical expression therefor is Sign($\Sigma X i - n$).
2. If a new variable Xj is logically added to the existing expression, a coefficient Wj for the new variable Xj is the same value as the preceding threshold value $T_{j-1}$. And the new threshold value Tj is held to the preceding value $T_{j-1}$.
3. If the new variable Xj and an existing expression are subjected to logical product, the coefficient Wj for the new variable is ($\Sigma W_{j-1}+1$) which is a sum of 1 and a result of subtraction of the preceding threshold value $T_{j-1}$ from a sum $\Sigma W_{j-1}$ of coefficients of the preceding variables. The new threshold value Tj is $\Sigma W_{j-1}+1$.

The terms in Sign($\Sigma W i X i - T$) having been determined in the above manner are divided by the threshold value T and Sign($\Sigma \omega i X i - 1$) is then calculated.

According to this procedure, if $$Y = X_1(X_2+X_3(X_4+X_5(X_6+X_7))) \quad (15)$$

is transformed into Y=Sign($\Sigma W i X i - 1$) for example, the following expression can be obtained:

$$Y = \text{Sign}(13X_1+8X_2+5X_3+3X_4+2X_5+X_6+X_7-21) \quad (16)$$

Transforming this expression into the form of Y=Sign ($\Sigma \omega i X i - 1$), the following expression can be obtained:

$$Y = \text{Sign}(0.65X_1+0.344X_2+0.215X_3+0.129X_4+0.086X_5+0.043X_6+0.043X_7-1) \quad (17)$$

As has been described above, the threshold element of the present invention is easier to design and manufacture than a conventional one, and complexity of setting is alleviated. Furthermore, the threshold element can be formed by fewer transistors than a conventional one. Moreover, changing the logical expression as an operation target is possible after installing the element. Therefore, substantial down-sizing and cost reduction can be realized upon forming a logical operation circuit.

What is claimed is:

1. A threshold element comprising MIS transistors connected in parallel, each passing a drain current upon excitation thereof in accordance with a weight ωi of an input Xi obtained by a logical expression Y=Sign($\Sigma \omega i X i - 1$) transformed from a logical expression Y=F(Xi) where Sign(A)=1 if $A \geq 0$ and Sign(A)=0 if $A \geq 0$, and each having a terminal connected to a gate electrode thereof for receiving a corresponding input signal Xi controlling the excitation thereof, and a comparing inverter for comparing an output voltage in accordance with a sum of the drain current from each of the transistors with a threshold value and for outputting a comparison result, wherein each of the MIS transistors through which the drain current corresponding to ωi flows comprises a first MIS transistor element and a second MIS transistor element connected in series whose effective β value adjusted by the width and length of the gate electrode the first transistor element and the second transistor switches the threshold element on and off corresponding to the input signal to a gate electrode of the second MIS transistor element.

2. The threshold element as claimed in claim 1, wherein each of the MIS transistors has a β value adjusted by the width and length of the gate electrode thereof.

3. The threshold element as claimed in claim 1, wherein each of the MIS transistors connected in parallel has a first terminal connected to a common electrode, and a second terminal connected to a power supply electrode via a complementary-channel MIS transistor which is always ON, the second terminal also being connected to the comparing inverter.

4. The threshold element as claimed in claim 3, wherein the MIS transistors connected in parallel are n-channel MOS transistors and the complementary-channel MIS transistor is a p-channel MOS transistor.

5. The threshold element as claimed in claim 3, wherein an effective β value of the complementary-channel MIS transistor is set to a value approximately equal to a value corresponding to 1 and having a deviation δ from the value corresponding to 1 which is smaller than a value corresponding to a smallest ωi among weights ωi of inputs Xi existing in a logical expression to be solved by the threshold element while effective β values of the MIS transistors through which the drain currents corresponding to the weight ωi flow are all set to values smaller than the value corresponding to 1, and a threshold value of the comparing inverter is set to a median value between power supply voltages.

6. The threshold element as claimed in claim 1, the threshold element being formed to solve a logical expression Y showing a logical sum of n Xi's, wherein the MIS transistors are transistors each passing the drain current corresponding to a weight ωi obtained by a logical expression Y=Sign($\Sigma 1 \cdot X i - 1$).

7. The threshold element as claimed in claim 1, the threshold element being formed to solve a logical expression Y showing a logical product of n Xi's, wherein the MIS transistors are transistors each passing the drain current corresponding to a weight ωi obtained from a logical expression Y=Sign($\Sigma (1/n) X i - 1$).

8. The threshold element as claimed in claim 1, the threshold element being formed to solve a logical expression Y showing $X_1(X_2+X_3)$, wherein the MIS transistors are transistors each passing the drain current corresponding to a weight ωi obtained from a logical expression Y=Sign((⅔)$X_1$+(⅓)$X_2$+(⅓)$X_3$−1).

9. The threshold element as claimed in claim 1, the threshold element being formed to solve a logical expression Y showing $X_1X_2+X_2X_3+X_3X_1$, wherein the MIS transistors are transistors each passing the drain current corresponding to a weight $\omega i$ obtained from a logical expression $Y=\text{Sign}((\frac{1}{2})X_1+(\frac{1}{2})X_2+(\frac{1}{2})X_3-1)$.

10. The threshold element as claimed in claim 1, the threshold element being formed to solve a logical expression Y showing $X_1X_2X_3$, wherein the MIS transistors are transistors each passing the drain current corresponding to weight $\omega i$ obtained from a logical expression $Y=\text{Sign}((\frac{1}{3})X_1+(\frac{1}{3})X_2+(\frac{1}{3})X_3-1)$.

* * * * *